United States Patent
Gao et al.

(10) Patent No.: US 6,791,806 B1
(45) Date of Patent: Sep. 14, 2004

(54) TUNNELING BARRIER MATERIAL FOR A MAGNETIC RECORDING HEAD

(75) Inventors: Zheng Gao, Savage, MN (US); Sining Mao, Savage, MN (US); Khoung Tran, Fridley, MN (US); Janusz Nowak, Eden Prairie, MN (US); Jian Chen, Shakopee, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 106 days.

(21) Appl. No.: 10/216,515

(22) Filed: Aug. 9, 2002

Related U.S. Application Data

(60) Provisional application No. 60/325,901, filed on Sep. 28, 2001.

(51) Int. Cl.[7] .................................................. G11B 5/39
(52) U.S. Cl. ..................................................... 360/324.2
(58) Field of Search ........................................ 360/324.2

(56) References Cited

U.S. PATENT DOCUMENTS 6,347,049 B1 * 2/2002 Childress et al. ........... 365/173
6,657,825 B2 * 12/2003 Ho et al. ..................... 360/321

* cited by examiner

Primary Examiner—A. J. Heinz
(74) Attorney, Agent, or Firm—Brenoan Hanley

(57) ABSTRACT

A tunneling magnetoresistive stack configured to operate in a current-perpendicular-to-plane mode has a plurality of layers including a barrier layer. The TMR stack has a plurality of layers including a barrier layer, wherein the barrier layer is comprised of an insulating material selected from a group consisting of HfO, HfAlO, ZrO, TiO, TaO or NdO. The TMR stack exhibits a low resistance-area (RA) product, a stable magnetoresistive (MR) ratio, a lower RA product, a higher breakdown voltage of the TMR stack and enhanced thermal stability.

13 Claims, 8 Drawing Sheets

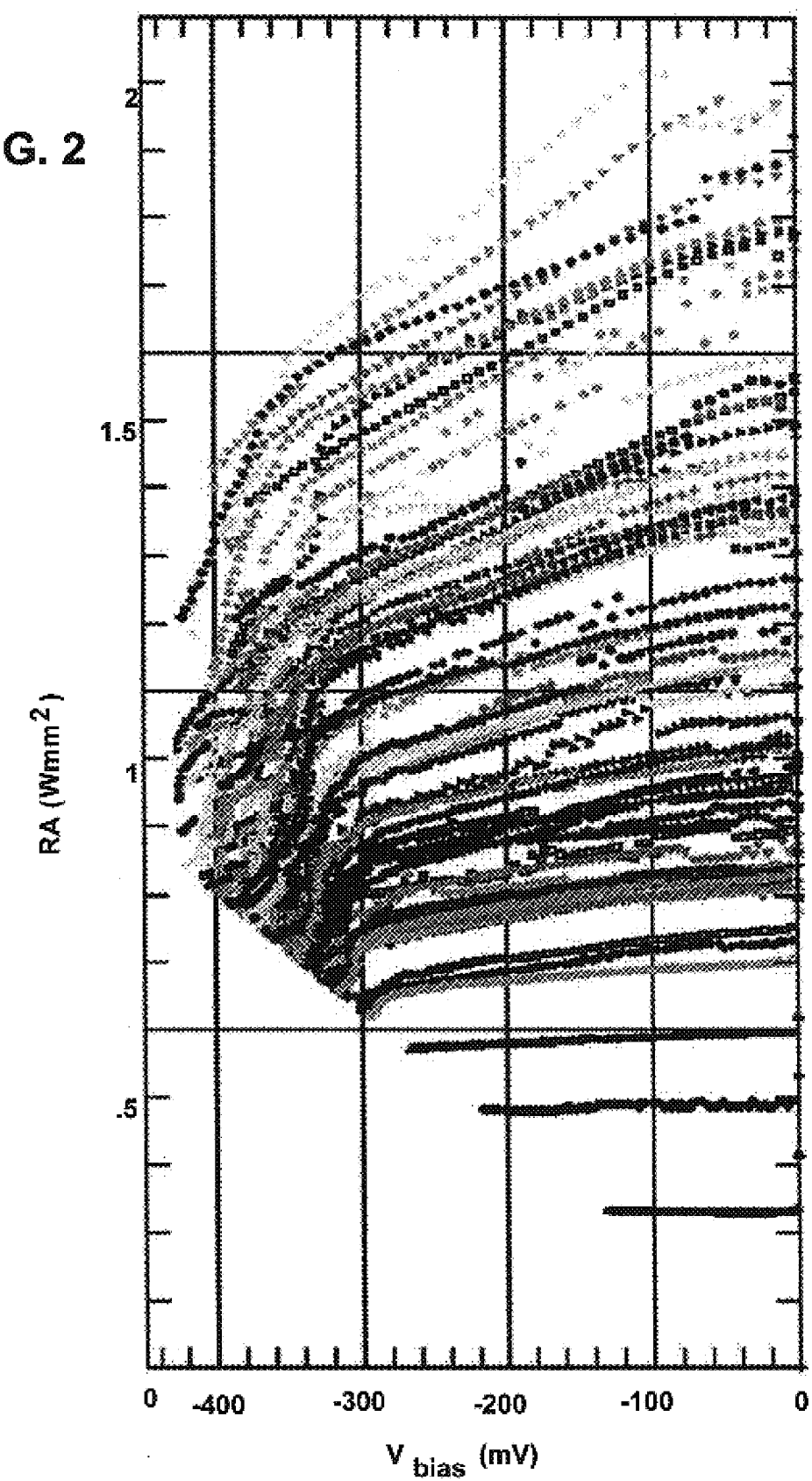

TUNNELING BARRIER MATERIAL FOR A MAGNETIC RECORDING HEAD

CROSS-REFERENCE TO RELATED APPLICATION(S)

This application claims priority from and incorporates by reference Provisional Application No. 60/325,901, filed Sept. 28, 2001 entitled "HfO As Tunneling Barrier Material For TGMR Recording Head Applications" by Z. Gao, S. Mao, K. Tran, J. Nowak and J. Chen.

BACKGROUND OF THE INVENTION

The present invention relates generally to a magnetoresistive sensor for use in a magnetic read head. In particular, the present invention relates to a tunneling magnetoresistive (TMR) read sensor having a low resistance-area (RA) product, yet maintaining a stable magnetoresistive (MR) ratio.

Magnetoresistive read sensors, such as giant magnetoresistive (GMR) read sensors, are used in magnetic data storage systems to detect magnetically-encoded information stored on a magnetic data storage medium such as a magnetic disc. A time-dependent magnetic field from a magnetic medium directly modulates the resistivity of the GMR read sensor. A change in resistance of the GMR read sensor can be detected by passing a sense current through the GMR read sensor and measuring the voltage across the GMR read sensor. The resulting signal can be used to recover the encoded information from the magnetic medium.

A typical GMR read sensor configuration is the GMR spin valve, in which the GMR read sensor is a multi-layered structure formed of a nonmagnetic spacer layer positioned between a synthetic antiferromagnet (SAF) and a ferromagnetic free layer. The magnetization of the SAF is fixed, typically normal to an air bearing surface of the GMR read sensor, while the magnetization of the free layer rotates freely in response to an external magnetic field. The SAF includes a reference layer and a pinned layer which are magnetically coupled by a coupling layer such that the magnetization direction of the reference layer is opposite to the magnetization of the pinned layer. The resistance of the GMR read sensor varies as a function of an angle formed between the magnetization direction of the free layer and the magnetization direction of the reference layer of the SAF. This multi-layered spin valve configuration allows for a more pronounced magnetoresistive effect, i.e. greater sensitivity and higher total change in resistance, than is possible with anisotropic magnetoresistive (AMR) read sensors, which generally consist of a single ferromagnetic layer.

A TMR read sensor is similar in structure to a GMR spin valve, but the physics of the device are different. For a TMR read sensor, rather than using a metallic spacer layer, an insulating barrier layer is positioned between the free layer and the SAF. Aluminum Oxide (AlO) is commonly used as a material for the barrier layer. Electrons must tunnel through the barrier layer. A sense current flowing perpendicularly to the plane of the layers of the TMR read sensor experiences a change in resistance which is proportional to the cosine of an angle formed between the magnetization direction of the free layer and the magnetization direction of the reference layer of the SAF.

A pinning layer is typically exchange coupled to the pinned layer of the SAF to fix the magnetization of the pinned layer in a predetermined direction. The pinning layer is typically formed of an antiferromagnetic material. In antiferromagnetic materials, the magnetic moments of adjacent atomic planes are aligned in alternating directions and, thus, there is no net magnetic moment in the material.

An underlayer is typically used to promote the texture of the pinning layer consequently grown on top of it. The underlayer is typically formed of a ferromagnetic material and is chosen such that its atomic structure, or arrangement, corresponds with a desired crystallographic direction.

A seed layer is typically used to enhance the grain growth of the underlayer consequently grown on top of it. In particular, the seed layer provides a desired grain structure and size. A seed layer may also be combined with the underlayer, in which combined layer performs the functions of both the underlayer and the seed layer.

One principal concern in the performance of TMR read sensors is the $\Delta R$ (the maximum absolute change in resistance of the TMR read sensor), which directly affects the magnetoresistive (MR) ratio. The MR ratio (the maximum absolute change in resistance of the TMR read sensor divided by the resistance of the TMR read sensor multiplied by 100%) determines the magnetoresistive effect of the TMR read sensor. Ultimately, a higher MR ratio yields a TMR read sensor with a greater magnetoresistive effect which is capable of detecting information from a magnetic medium with a higher linear density of data.

A key determinant of the MR ratio is the spin polarization of the sense current passing through the barrier layer. The sense current consists of majority spin electrons (spin is in the same direction of the magnetization) and minority spin electrons (spin is in the opposite direction of the magnetization). A spin polarized current has an unequal population of majority and minority spin electrons. According to the Julliere model of the TMR read sensor, the magnetoresistive effect in a tunneling junction is significantly enhanced if the sense current is spin polarized. This is because the magnetoresistive effect is determined by $\Delta R/R = 2PP'/(1-PP')$, where $\Delta R/R$ is the MR ratio, and P and P' are the spin polarization ratios of the effective tunneling density of states on each side of the barrier layer. The MR ratio reaches a maximum value for completely polarized tunneling density of states (P=P'=1).

Large signal output and reduced shield-to-shield spacing have made the TMR head attractive for high linear density application. However, one of the crucial factors strongly limiting the TMR sensor in recording head application is the large resistance at higher linear density, which results in large shot noise, thereby reducing the signal to noise ratio. Large resistance also increases the circuit response time since there is an equivalent capacitor in the reader circuit. Tremendous effort has been made to reduce the RA product of the TMR sensor in the past years. The lowest reported RA product of a given TMR sensor is 5 $\Omega \mu m^2$. Therefore, there is a need in the art for a TMR sensor with a low RA product.

BRIEF SUMMARY OF THE INVENTION

The present invention is a tunneling magnetoresistive (TMR) stack configured to operate in a current-perpendicular-to-plane (CPP) mode. The TMR stack has a plurality of layers including a barrier layer. The TMR stack exhibits a lower resistance-area (RA) product, a stable magnetoresistive (MR) ratio, a higher breakdown voltage of the TMR stack and enhanced thermal stability.

BRIEF DESCRIPTION OF THE DRAWINGS

FIG. 2 is a graph showing the RA product of the present invention in relation to the voltage bias of the present invention implementing the barrier material HfO.

DETAILED DESCRIPTION

Figure 1:
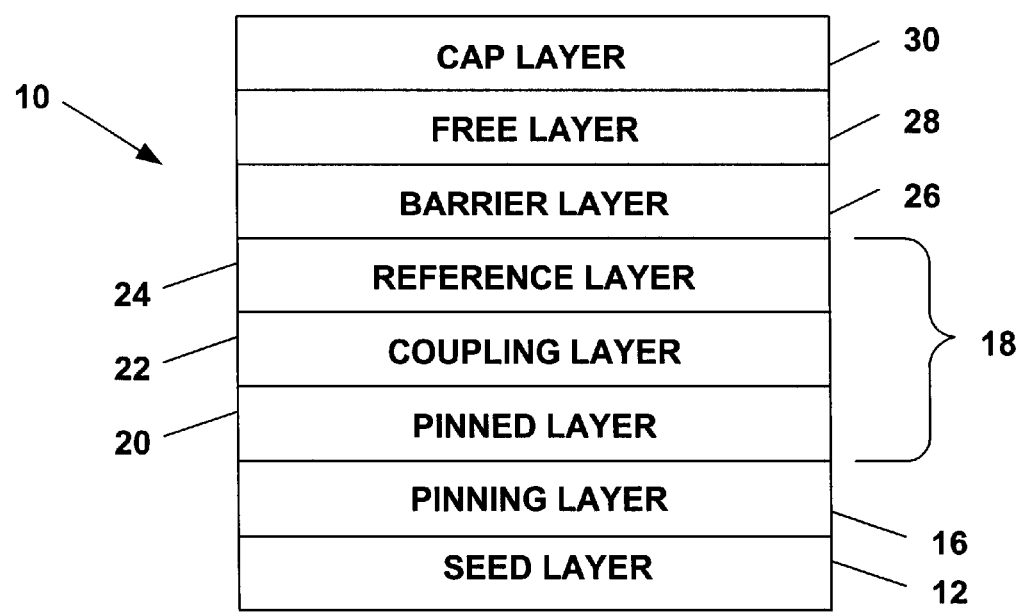
FIG. 1 is a layer diagram of a tunneling magnetoresistive stack of the present invention.
Figure 3A:
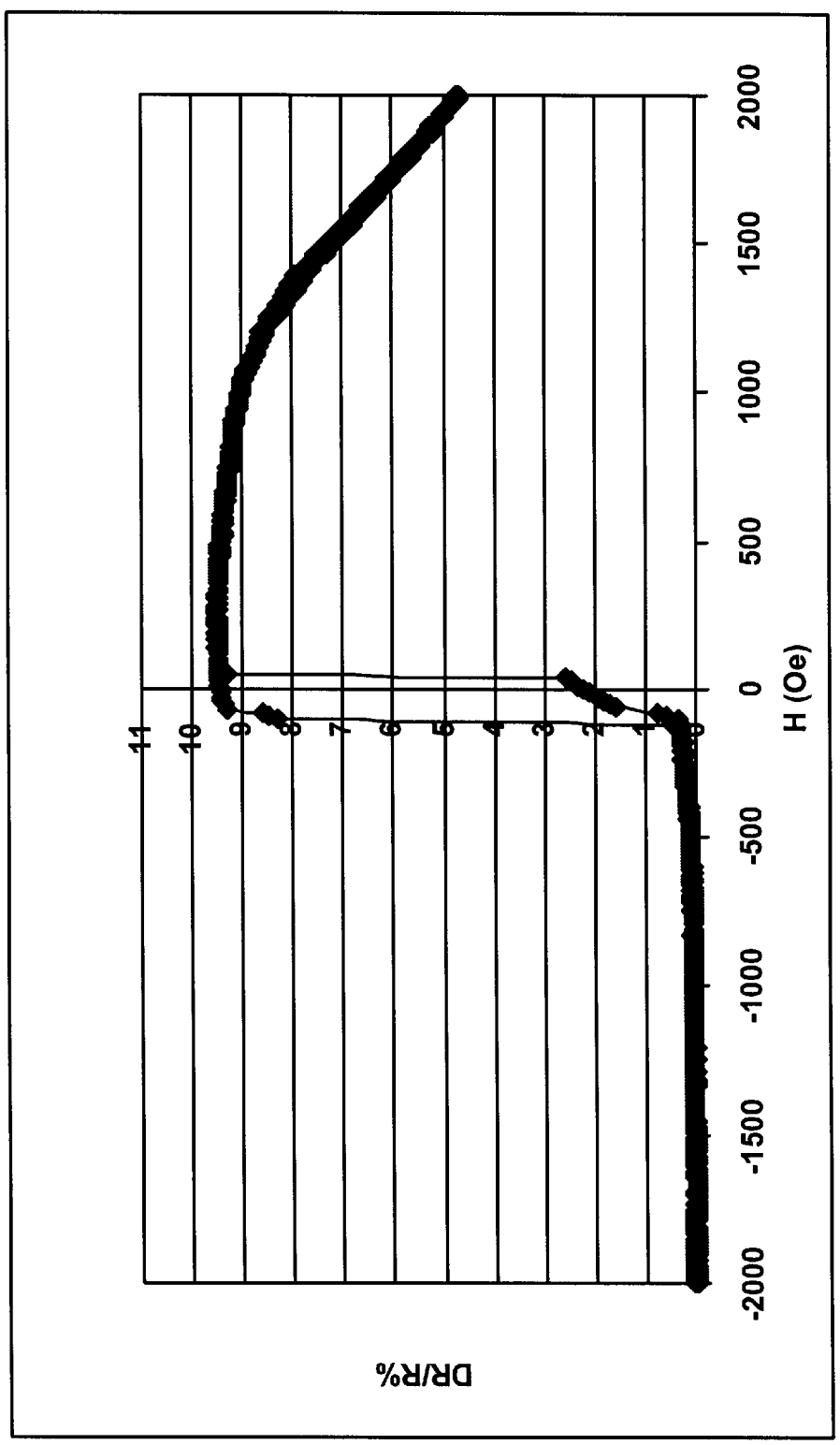
FIG. 3A is graph showing the TMR ratio of the present invention in relation to the magnetic field from the head of the present invention implementing the barrier material HfO.
Figure 3B:
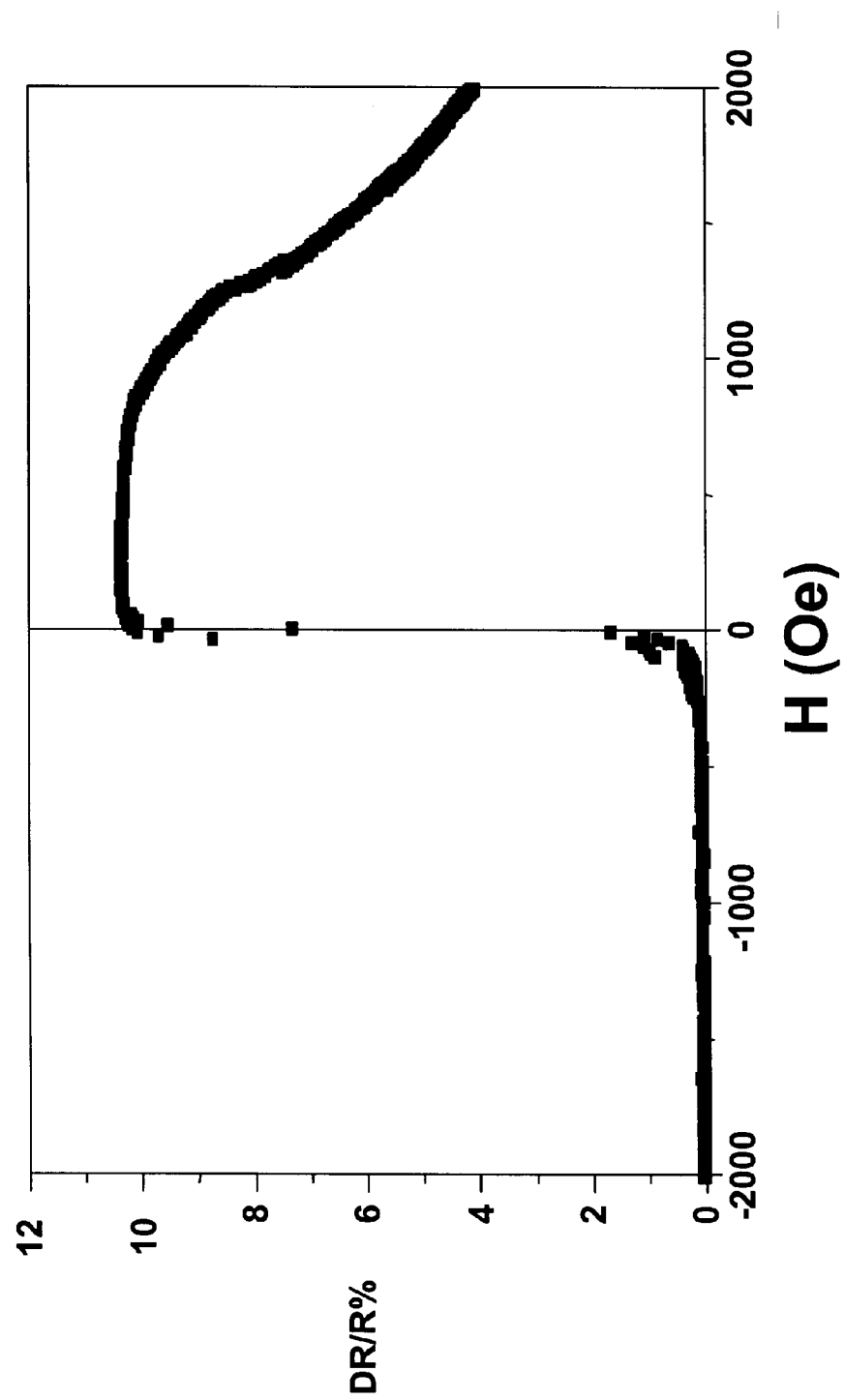
FIG. 3B is graph showing the TMR ratio of the present invention in relation to the magnetic field from the head of the present invention implementing the barrier material ZrO.
Figure 3C:
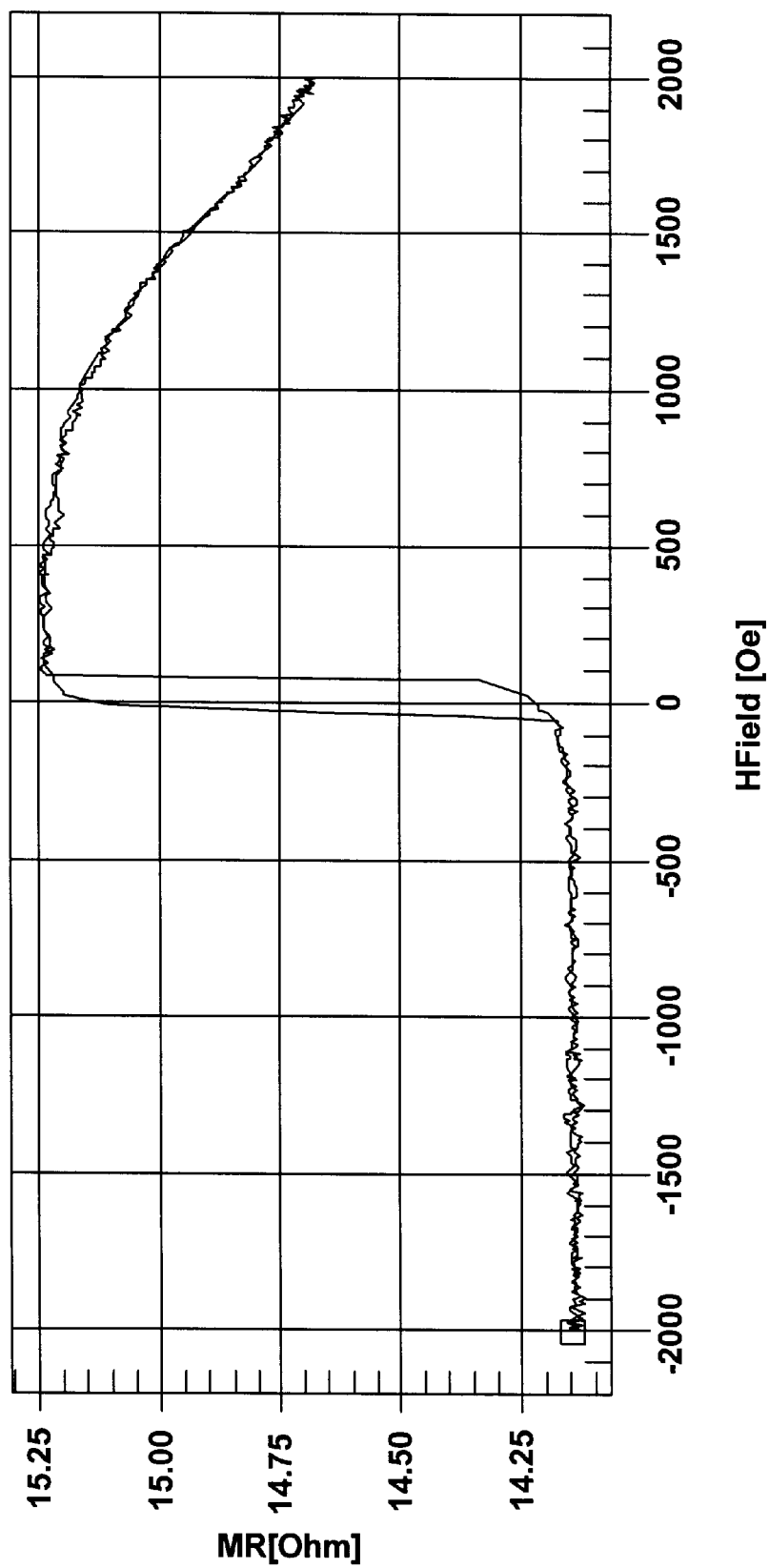
FIG. 3C is graph showing the MR of the present invention in relation to the magnetic field from the head of the present invention implementing the barrier material HfAlO.
Figure 3D:
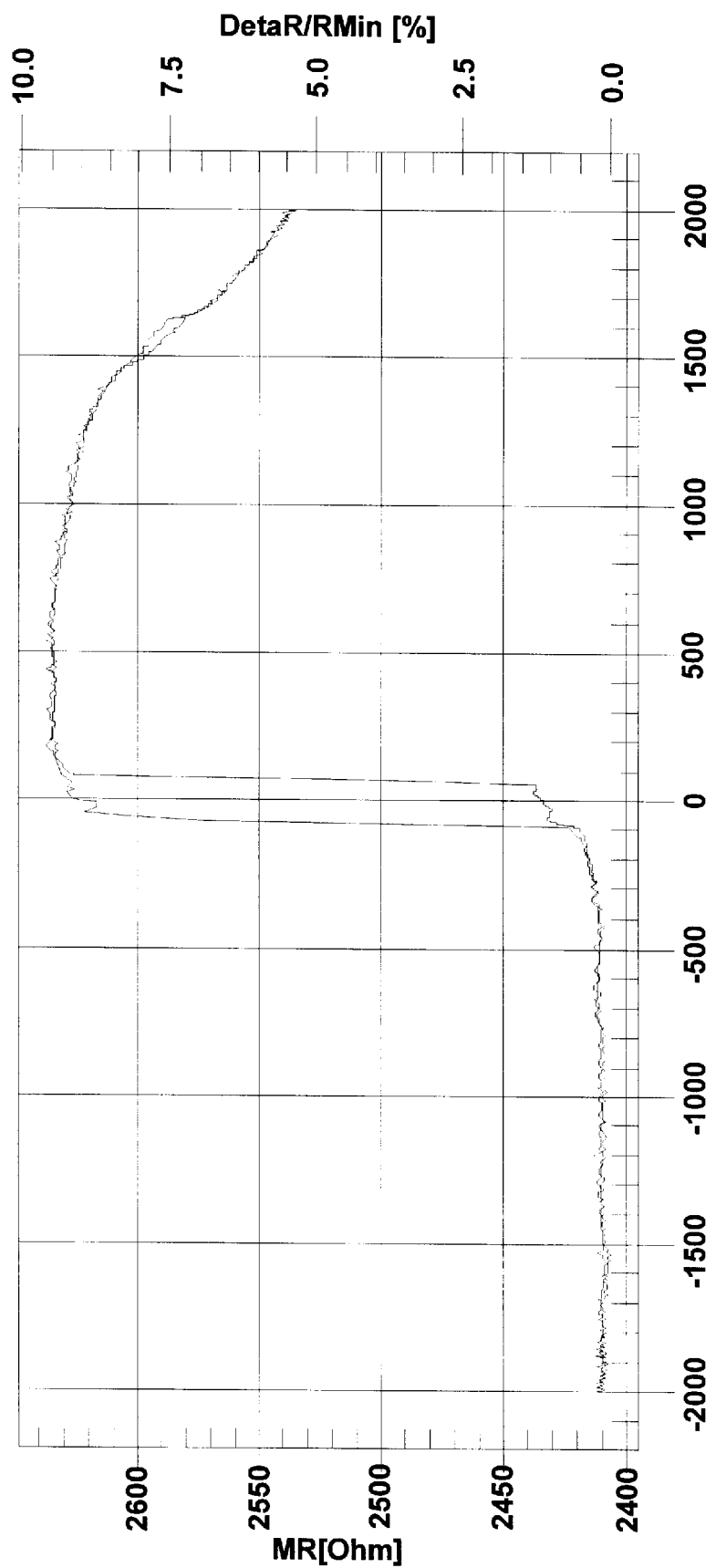
FIG. 3D is graph showing the TMR ratio of the present invention in relation to the magnetic field from the head of the present invention implementing the barrier material TiO.
Figure 3E:
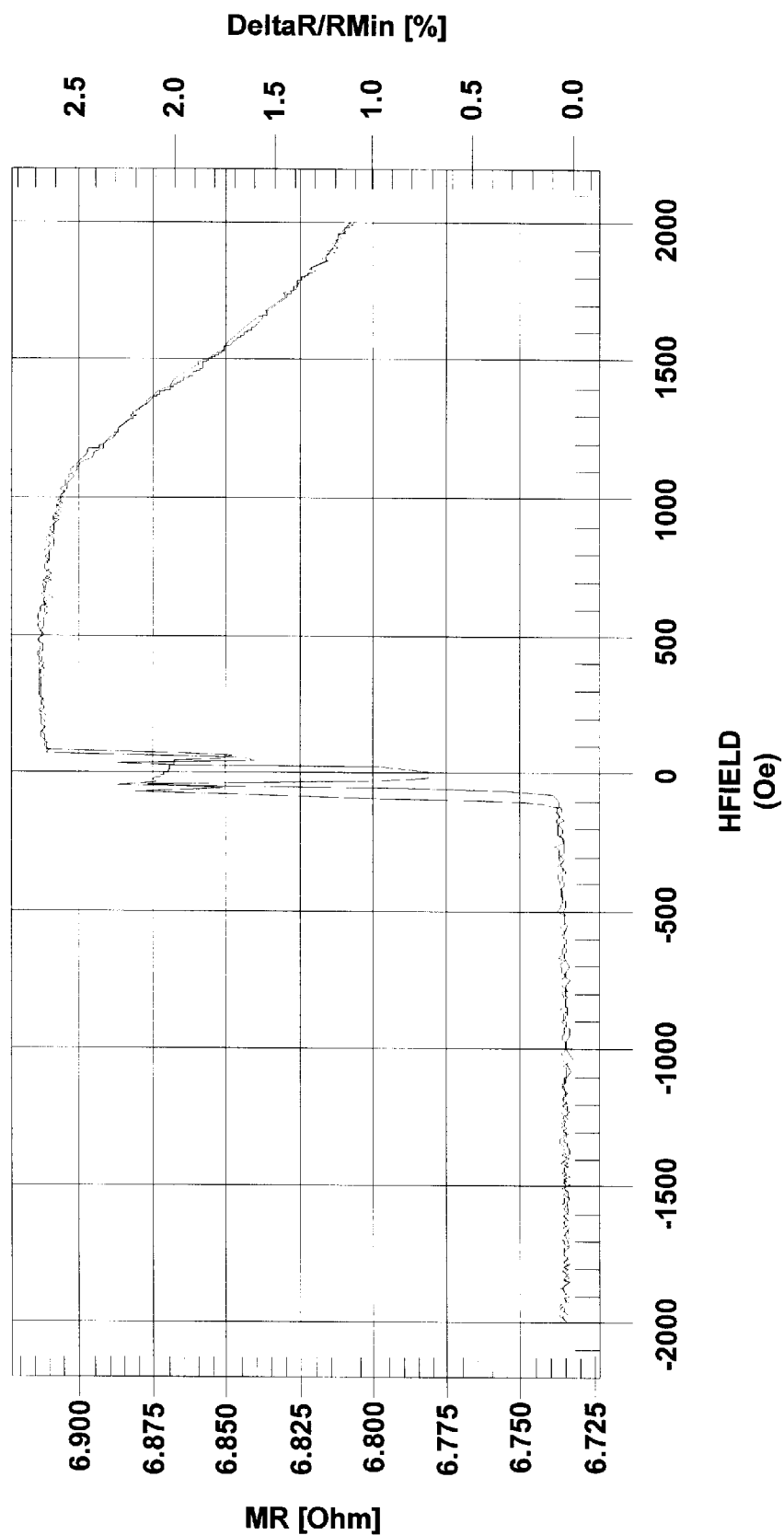
FIG. 3E is graph showing the TMR ratio of the present invention in relation to the magnetic field from the head of the present invention implementing the barrier material NdO.
Figure 3F:
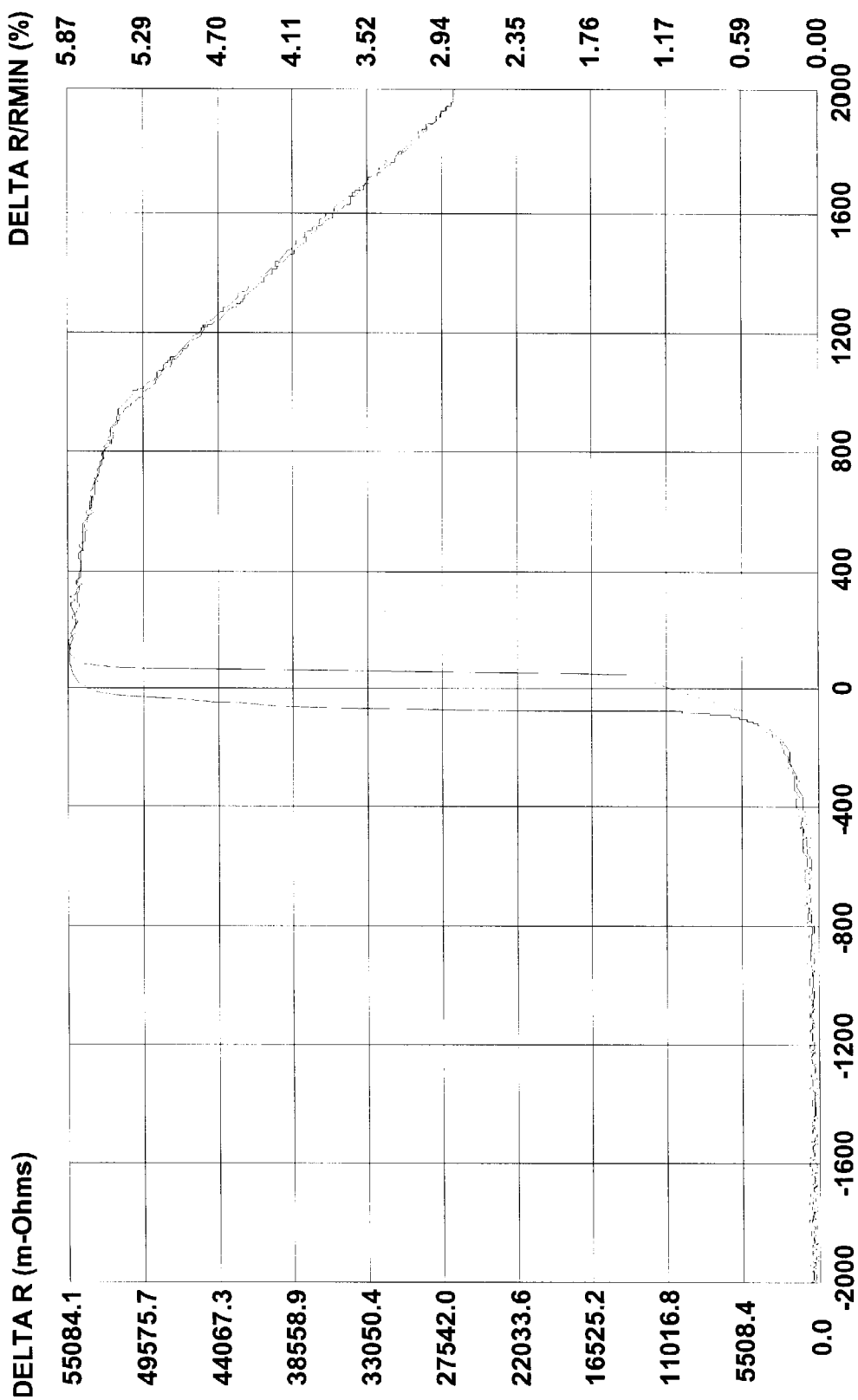
FIG. 3F is graph showing the TMR ratio of the present invention in relation to the magnetic field from the head of the present invention implementing the barrier material TaO.

FIG. 1 is a layer diagram of a tunneling magnetoresistive (TMR) stack 10 according to the present invention. TMR stack 10 includes a seed layer 12, a pinning layer 16, a synthetic antiferromagnet (SAF) 18, a barrier layer 26, a free layer 28, a cap layer 30, and top/bottom leads 32. The top and bottom leads 32 are preferably composed of Cu or other low resistive materials.

Seed layer 12 is preferably composed of Ta, Ta/NiFe, or NiFeCr/NiFe, and is positioned adjacent to bottom electrode 32. Pinning layer 16 is an antiferromagnetic material, preferably PtMn, and is positioned adjacent to seed layer 12. SAF 18 includes a ferromagnetic pinned layer 20, a ferromagnetic reference layer 24, and a coupling layer 22 positioned between the pinned layer 20 and reference layer 24. SAF 18 is positioned such that pinned layer 20 is adjacent to pinning layer 16. Pinned layer 20 and reference layer 24 are preferably CoFe, and coupling layer 22 is preferably Ru. Free layer 28 is a ferromagnetic material, preferably CoFe, NiFe, or CoFe/NiFe. Barrier layer 26 is an insulating material, preferably selected from the group consisting of HfO, HfAlO, TaO, NdO, TiO and ZrO, and is positioned between SAF 18 and free layer 28. The thickness of barrier layer 26 is preferably 3.5 to 8 Å. The barrier layer metals are oxidized by a natural oxidation process, under 30 Torr for 20 minutes. Those skilled in the art would recognized that other oxidation processes, such as plasma and UV, may be used without departing from the present invention. Cap layer 30 is preferably Ta or Cu, and is positioned between the free layer 28 and the top electrode 32.

The major advantage of using alternative junction barriers, such as the type disclosed in this application, is that a magnetic tunnel junction with a lower RA product and maintained large MR ratio can be achieved. With a traditional tunnel junction barrier material, such as $AL_2O_3$, the MR ratio decreases rapidly with small barrier thickness, and hence a small RA product. At a low RA product, tunnel junctions with barriers made of $AL_2O_3$ typically have a low MR ratio, whereas tunnel junctions with barriers made of the materials disclosed herein result in a stable or high MR ratio. Therefore, the barrier materials disclosed herein allow reduction of the sensor resistance for high areal-density applications without sacrificing the output signal, which is proportional to the MR ratio. Table 1 illustrates the significance of using HfO, HfAlO, ZrO, or TiO as a barrier layer. Table 1 shows the RA product realized from the respective barriers with different thicknesses. One skilled in the art will appreciate that materials listed in Table 1, which have larger RA products, may have their RA products lowered by optimizing the oxidation level and thickness of the barrier. For instance, that implementation of NdO at approximately 8 Å produces an RA product of 100–150 $\Omega\mu m^2$ and TaO produces an RA product of 8–12 $\Omega\mu m^2$ These values may be lowered if the barrier layer implementing NdO or TaO is optimized by oxidation level and barrier thickness. In Table 1, HfO has been optimized, yet TiO, HfAlO, and ZrO have not been optimized.

TABLE 1

| Barrier Material | HfO | TiO | HfAlO | ZrO |
| --- | --- | --- | --- | --- |
| Metal thickness (A) | 4.5 | 8 | 5.5 | 5 |
| RA (Ohm.um2) | 0.3~1.2 | 1~2 | 2~3 | 2~5 |

The magnetization of SAF 18 is fixed while the magnetization of free layer 28 rotates freely in response to an external magnetic field emanating from an external field. Reference layer 24 and pinned layer 20 are magnetically coupled by coupling layer 22 such that the magnetization direction of reference layer 24 is opposite to the magnetization direction of pinned layer 20. The magnetization of pinned layer 20 is pinned by exchange coupling the field between pinning layer 16 and pinned layer 20. Seed layer 12 promotes the crystallographic texture of pinning layer 16. The resistance of TMR stack 10 varies as a function of an angle that is formed between the magnetization of free layer 22 and the magnetization of reference layer 24.

The TMR signal produced by TMR stack 10 is generated by a sense current flowing perpendicularly through the layers of TMR stack 10 from cap layer 30 to seed layer 12 and from seed layer 12 to cap layer 30. By passing a bias current through two metallic leads that are placed in direct contact with the top and bottom leads 32, conducting electrons are forced to tunnel through the insulating barrier layer 26. The output signal that results from the change of the tunneling conductance is maximum when the alignment of the of the reference layer 24 and free layer 28 are antiparallel and minimum when the alignment is parallel. TMR stack 10 optimally exhibits an RA product of 1 $\Omega\mu m^2$, a MR ratio of 8%, a breakdown voltage of over 300 mV, and survival of a thermal anneal of 290° C. for 2 hours, all of which is more fully shown and described in FIGS. 2–4.

FIG. 2 is a graph showing the RA product of the present invention in relation to the voltage bias of the present invention, which implements the barrier layer material HfO. The graph in FIG. 2 shows the results of testing the breakdown voltage for 64 TMR stacks in accordance with the present invention. Each line on the graph represents a TMR stack with a different thickness of barrier layer in accordance with the present invention. An important issue when operating TMR stack 10 is to maximize voltage breakdown. The graph of FIG. 2 illustrates that TMR stack 10 can withstand a post anneal temperature of up to 290° C. for 2 hours, can withstand a voltage of over 300 mV, and still maintain a RA product of 1 $\Omega\mu m^2$. Normally, anneal will make a RA product increase, but the overlapping of values in the graph of FIG. 2 exemplify that the RA product is very stable after the various thermal anneals. The thin barrier layer 26, as disclosed, is thermally stable, which is vital for head operation.

FIGS. 3A–3F are graphs showing a MR value of the present invention in relation to the magnetic field from the head of the present invention. FIGS. 3A–3F represent barrier materials HfO, ZrO, HfAlO, TiO, NdO, and TaO, respectively. The apparatus in FIG. 3A was post annealed for 2 hours at 270° C. The apparatus in FIGS. 3B–3F were AS Finished for 4 hours at 250° C. The graphs of FIGS. 3A–3F illustrate that TMR stack 10 will operate efficiently, showing a stable MR ratio, and a high pinning field.

Although the present invention has been described with reference to preferred embodiments, workers skilled in the art will recognize that changes may be made in form and detail without departing from the spirit and scope of the invention. For instance, workers skilled in the art may change the thickness of the barrier layers disclosed herein to create lower RA values, without departing from the present invention.

What is claimed is:

1. A tunneling magnetoresistive stack configured to operate in a current-perpendicular-to-plane mode, the tunneling magnetoresistive stack comprising:
    a cap layer;
    a free layer position adjacent to the cap layer;
    a synthetic antiferromagnet comprising;
        a ferromagnetic reference layer having a fixed magnetic moment;
        a ferromagnetic pinned layer having a fixed magnetic moment; and
        a coupling layer positioned between the reference layer and the pinned layer;
    a barrier layer positioned between the free layer and the reference layer of the synthetic antiferromagnet, wherein the barrier layer is comprised of HfO;
    an antiferromagnet pinning layer positioned adjacent to the pinned layer of the synthetic antiferromagnet; and
    a seed layer positioned adjacent the pinning layer.

2. A read sensor for use in a magnetic read head, the read sensor comprising:
    a tunneling magnetoresistive stack having a barrier layer composed of HfO, the tunneling magnetoresistive stack configured to operate in a current-perpendicular-to-plane mode wherein a sense current flows substantially perpendicular to a longitudinal plane of the barrier layer; and
    means for causing the tunneling magnetoresistive stack to exhibit a magnetoresistive ratio approximately 2.5% to 12% and a resistance-area product approximately 0.3 to 2 $\Omega\mu m^2$.

3. The read sensor of claim 2, wherein the tunneling magnetoresistive stack filer includes a cap layer and a free layer, wherein said free layer is positioned between said cap layer and said barrier layer.

4. The read sensor of claim 3, wherein the tunneling magnetoresistive stack further includes a synthetic antiferromagnet layer, wherein said barrier layer is positioned between the synthetic antiferromagnet layer and the free layer.

5. The read sensor of claim 4, wherein the synthetic antiferromagnet includes a ferromagnetic pinned layer having a fixed magnetic moment, a ferromagnetic reference layer having a fixed magnetic moment, and a coupling layer positioned between the pinned layer and the reference layer.

6. The read sensor of claim 4, wherein the tunneling magnetoresistive stack further includes an antiferromagnetic pinning layer positioned adjacent to the synthetic antiferromagnet.

7. The read sensor of claim 4, wherein the tunneling magnetoresistive stack further includes a seed layer positioned adjacent the pinning layer.

8. A read sensor for use in a magnetic read head, the read sensor comprising a tunneling magnetoresistive stack having a barrier layer, the barrier layer comprised of HfO, further the tunneling magnetoresistive stack configured to operate in a current-perpendicular-to-plane mode wherein a sense current flows substantially perpendicular to a longitudinal plane of the barrier layer; further wherein the tunneling magnetoresistive stack exhibits a magnetoresistive ratio approximately 2.5% to 12% and a resistance-area product approximately 0.3 to 1 $\Omega\mu m^2$.

9. The read sensor of claim 8, wherein the tunneling magnetoresistive stack further includes a cap layer and a free layer, wherein said free layer is positioned between said cap layer and said barrier layer.

10. The read sensor of claim 8, wherein the tunneling magnetoresistive stack further includes a synthetic antiferromagnet, wherein the synthetic antiferromagnet includes a ferromagnetic pinned layer having a fixed magnetic moment, a ferromagnetic reference layer having a fixed magnetic moment, and a coupling layer positioned between the pinned layer and the reference layer.

11. The read sensor of claim 10, wherein the synthetic antiferromagnet includes a ferromagnetic free layer having a rotatable magnetic moment, wherein said barrier layer is positioned between the reference layer of the synthetic antiferromagnet and the free layer.

12. The read sensor of claim 10, wherein the tunneling magnetoresistive stack further includes an antiferromagnetic pinning layer positioned adjacent to the synthetic antiferromagnet.

13. The reader of claim 10, wherein the tunneling magnetoresistive stack further includes a seed layer positioned adjacent the pinning layer.

* * * * *

UNITED STATES PATENT AND TRADEMARK OFFICE
CERTIFICATE OF CORRECTION

PATENT NO. : 6,791,806 B1
DATED : September 14, 2004
INVENTOR(S) : Zheng Gao et al.

It is certified that error appears in the above-identified patent and that said Letters Patent is hereby corrected as shown below:

Title page,
Item [74], *Attorney, Agent, or Firm*, replace "Brenoan" with -- Brendan --.

Signed and Sealed this

Twenty-sixth Day of October, 2004

JON W. DUDAS
*Director of the United States Patent and Trademark Office*